(12) United States Patent
Kando et al.

(10) Patent No.: US 10,009,010 B2
(45) Date of Patent: Jun. 26, 2018

(54) RESONATOR DEVICE AND HIGH FREQUENCY FILTER

(71) Applicant: Murata Manufacturing Co., Ltd., Kyoto (JP)

(72) Inventors: Hajime Kando, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 135 days.

(21) Appl. No.: 15/076,965

(22) Filed: Mar. 22, 2016

(65) Prior Publication Data

US 2016/0204755 A1  Jul. 14, 2016

Related U.S. Application Data

(63) Continuation of application No. PCT/JP2014/073444, filed on Sep. 5, 2014.

(30) Foreign Application Priority Data

Sep. 26, 2013  (JP) .................................. 2013-199160

(51) Int. Cl.
*H03H 9/54*   (2006.01)
*H03H 9/52*   (2006.01)
(Continued)

(52) U.S. Cl.
CPC .............. *H03H 9/542* (2013.01); *H03H 5/12* (2013.01); *H03H 7/0115* (2013.01);
(Continued)

(58) Field of Classification Search
CPC ...... H03H 5/12; H03H 7/0115; H03H 7/0161; H03H 9/54; H03H 9/542; H03H 9/545;
(Continued)

(56) References Cited

U.S. PATENT DOCUMENTS 5,789,845 A  *  8/1998  Wadaka ................ H03B 5/326
                                                   310/311
5,933,062 A  *  8/1999  Kommrusch ........ H03H 9/6483
                                                   310/313 B
(Continued)

FOREIGN PATENT DOCUMENTS

CN       1649265 A        8/2005
JP       H10-173475 A     6/1998
(Continued)

OTHER PUBLICATIONS

English language machine translation of JP 2002-223147, published Aug. 9, 2002, 8 pages.*

(Continued)

*Primary Examiner* — Barbara Summons
(74) *Attorney, Agent, or Firm* — Pearne & Gordon LLP

(57) ABSTRACT

A resonant circuit includes a resonator having a resonant frequency and an anti-resonant frequency, an inductor connected in series to the resonator, an inductor connected in parallel to the resonator, and a series circuit in which a variable capacitor is connected in series to an inductor (15). The series circuit is connected in parallel to the resonator. The anti-resonant frequency closest to the resonant frequency of the resonator is moved toward higher frequencies or lower frequencies of the resonant frequency on a frequency axis with a variation in the capacitance value of the variable capacitor. With this configuration, a resonator device and a high-frequency filter are provided, in which the relationship between a transmission frequency band and a reception frequency band on the frequency axis is applicable to a variety of multiple communication bands.

13 Claims, 9 Drawing Sheets

(51) Int. Cl.
*H03H 9/64* (2006.01)
*H03H 7/01* (2006.01)
*H03H 5/12* (2006.01)
*H03H 9/56* (2006.01)
*H03H 9/02* (2006.01)

(52) U.S. Cl.
CPC ............ *H03H 7/0161* (2013.01); *H03H 9/54* (2013.01); *H03H 9/545* (2013.01); *H03H 9/568* (2013.01); *H03H 9/64* (2013.01); *H03H 9/6403* (2013.01); *H03H 9/6423* (2013.01); *H03H 9/6483* (2013.01); *H03H 2009/02204* (2013.01); *H03H 2210/025* (2013.01)

(58) Field of Classification Search
CPC ........ H03H 9/568; H03H 9/64; H03H 9/6403; H03H 9/6423; H03H 9/6483; H03H 2009/02204; H03H 2210/025
USPC .......................................... 333/187, 189, 193
See application file for complete search history.

(56) References Cited

U.S. PATENT DOCUMENTS

| | | | | |
|---|---|---|---|---|
| 6,018,281 | A * | 1/2000 | Taguchi | H03H 9/64 310/313 R |
| 6,909,338 | B2 | 6/2005 | Omote | |
| 7,030,718 | B1 * | 4/2006 | Scherer | H03J 3/20 331/117 R |
| 8,339,220 | B2 * | 12/2012 | Fedan | H03H 9/6406 333/193 |
| 8,446,227 | B2 * | 5/2013 | Rebel | H03B 5/30 331/107 A |
| 8,552,818 | B2 | 10/2013 | Kadota et al. | |
| 2004/0119561 | A1 | 6/2004 | Omote | |
| 2005/0212612 | A1 | 9/2005 | Kawakubo et al. | |
| 2012/0286900 | A1 | 11/2012 | Kadota et al. | |
| 2015/0155852 | A1 * | 6/2015 | Lee | H03H 9/542 333/190 |

FOREIGN PATENT DOCUMENTS

| | | |
|---|---|---|
| JP | 2002-223147 A1 | 8/2002 |
| JP | 2004-173245 A | 6/2004 |
| JP | 2009-130831 A1 | 6/2009 |
| JP | 2011-071911 A | 4/2011 |
| JP | 2012-257050 A | 12/2012 |
| WO | 2011/036978 A1 | 3/2011 |
| WO | 2011/093449 A1 | 8/2011 |

OTHER PUBLICATIONS

Written Opinion for PCT/JP2014/073444 dated Dec. 9, 2014.
International Search report for PCT/JP2014/073444 dated Dec. 9, 2014.
English translation Written Opinion for PCT/JP2014/073444 dated Dec. 9, 2014.

* cited by examiner

RESONATOR DEVICE AND HIGH FREQUENCY FILTER

BACKGROUND

Technical Field

The present disclosure relates to a resonator device having a resonance point and an anti-resonance point and to a high-frequency filter including the resonator device.

Communication apparatuses in recent years establish communication in various frequency bands. Accordingly, the communication apparatuses each include multiple filters corresponding to the multiple frequency bands and switch the filter to be used for every required frequency band. The filter is desirably a tunable filter (variable filter) capable of varying bandpass characteristics across wider frequency bands, for example, as described in Patent Document 1.

Patent Document 1: Japanese Unexamined Patent Application Publication No. 2009-130831

BRIEF SUMMARY

The communication apparatuses in recent years have transmission frequency bands at the low frequency side or the high frequency side of reception frequency bands, depending on their communication bands. With the tunable filter described in the Patent Document 1, it is not possible to reverse the relationship between the pass band and the attenuation band on a frequency axis even if bandpass characteristics or attenuation characteristics are capable of being adjusted. Accordingly, it is not possible to use one tunable filter for multiple communication bands having the reverse relationship between the transmission frequency band and the reception frequency band on the frequency axis and it is necessary to provide individual tunable filters.

The present disclosure provides a resonator device and a high-frequency filter having the relationship between the transmission frequency band and the reception frequency band on the frequency axis, which is applicable to a variety of multiple communication bands.

The present disclosure provides a resonator device including a resonator having a resonant frequency and an anti-resonant frequency; and a first series circuit in which a first inductor is connected in series to a first variable capacitor. The first series circuit is connected in parallel to the resonator. The anti-resonant frequency closest to the resonant frequency of the resonator is moved toward higher frequencies or lower frequencies of the resonant frequency on a frequency axis with a variation in the capacitance value of the first variable capacitor.

With the above configuration, the anti-resonant frequency of the resonator is capable of being varied and varying the capacitance of the first variable capacitor enables the anti-resonant frequency to be adjusted to a desired anti-resonant frequency. Accordingly, when the resonator according to the present disclosure is used for, for example, a high-frequency filter, it is possible to adjust the attenuation band with little variation in the pass band and to adjust the pass band with little variation in the attenuation band in order to achieve desired transmission characteristics.

In addition, with the above configuration, varying the capacitance value of the first variable capacitor enables the anti-resonant frequency closest to the resonant frequency to be inverted from the high frequency side to the low frequency side (or from the low frequency side to the high frequency side) with respect to the resonant frequency. Accordingly, when the resonator is used for, for example, a high-frequency filter, it is also possible to switch the positional relationship between the pass band and the attenuation band on the frequency axis. In addition, it is possible to adjust attenuation band characteristics or pass band characteristics in accordance with the desired transmission characteristics, thereby achieving the desired transmission characteristics.

In the present disclosure, a condition $Li > 1/(\omega r^2 \times Cp)$ or $Li < 1/(\omega r^2 \times Cp)$ can be met where $\omega r$ denotes a resonance angular frequency of the resonator, Li denotes an inductance of the first inductor, and Cp denotes a capacitance of the first variable capacitor.

With the above configuration, the anti-resonant frequency closest to the resonant frequency of the resonator is positioned at the high frequency side or the low frequency side of the resonant frequency.

The inductance Li can have a value of 0.2 nH or higher.

With the above configuration, since the first inductor is an element having a small manufacturing variation, it is possible to adjust the anti-resonant frequency with high precision.

In the present disclosure, the resonator device can include a second series circuit in which a second inductor is connected in series to a second variable capacitor and the second series circuit be connected in series to the parallel circuit composed of the resonator and the first series circuit.

With the above configuration, the resonant frequency of the resonator is also capable of being varied and varying the capacitance of the second variable capacitor enables the resonant frequency to be adjusted to a desired resonant frequency. Accordingly, when the resonator according to the present disclosure is used for, for example, a high-frequency filter, it is possible to adjust both the attenuation band characteristics and the pass band characteristics in accordance with the desired transmission characteristics to achieve a greater variety of transmission characteristics.

According to the present disclosure, it is possible to realize the resonator device capable of adjusting the anti-resonant frequency with a simple configuration. When the resonator device is used for, for example, a high-frequency filter, it is possible to adjust the attenuation band characteristics or the pass band characteristics in order to achieve desired transmission characteristics, thereby realizing a variety of filter characteristics.

DETAILED DESCRIPTION

First Embodiment

Figure 1:
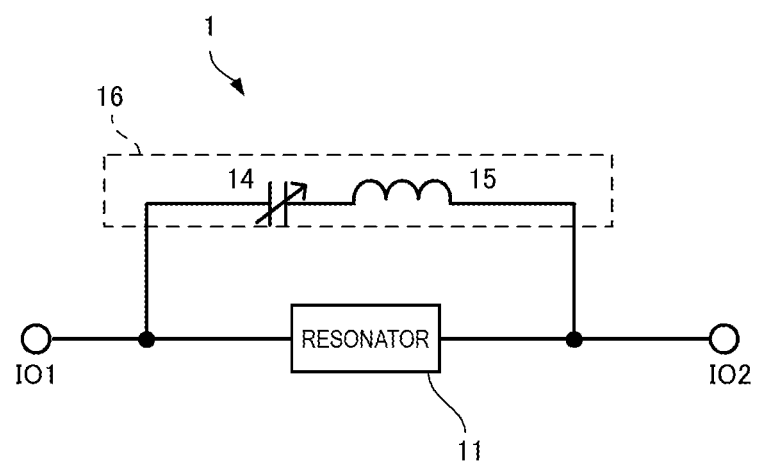
FIG. 1 is a circuit diagram of a resonant circuit according to a first embodiment.

FIG. 1 is a circuit diagram of a resonant circuit 1 according to the present embodiment. The resonant circuit 1 corresponds to a resonator device according to the present disclosure.

The resonant circuit 1 includes a resonator 11. The resonator 11 is an element having a resonance point (resonant frequency) and an anti-resonance point (anti-resonant frequency). Specifically, the resonator 11 is a piezoelectric resonator and, for example, is a surface acoustic wave (SAW) device. The resonant circuit 1 according to the present embodiment has a center frequency of 800 MHz and a characteristic impedance of 50Ω. The SAW device has a structure in which a comb-shaped pattern is formed of a thin film made of Al or an Al alloy. The comb-shaped pattern is formed on a piezoelectric thin film and extracts an electrical signal within a certain frequency band. The resonator 11 may be a bulk acoustic wave (BAW) device.

The resonant circuit 1 includes a series circuit 16 in which a variable capacitor 14 is connected in series to an inductor 15. The series circuit 16 is connected to input-output terminals IO1 and IO2. In other words, the series circuit 16 is connected in parallel to the resonator 11.

The variable capacitor 14 may be, for example, a variable capacitance diode, a Micro Electro Mechanical Systems (MEMS) device, or a Barium Strontium Titanate (BST) device.

The connection of the series circuit 16 in parallel to the resonator 11 enables the anti-resonance point of the resonator 11 to be adjusted. Specifically, when the capacitance of the variable capacitor 14 is denoted by Cp and the inductance of the inductor 15 is denoted by Lp, the resonant circuit 1 may have the anti-resonance point at the high frequency side or the low frequency side of the resonance point depending on a combination of the capacitance Cp and the inductance Lp.

Although the resonant circuit 1 has multiple anti-resonance points, the anti-resonance point of the present embodiment means the anti-resonance point closest to the resonant frequency of the resonator 11.

The inductance Lp at the resonant frequency of the series resonant circuit composed of the inductor 15 and the variable capacitor 14 is represented by $Lp=1/(\omega r^2 \times Cp)$ where $\omega r$ denotes an angular frequency at the resonance point of the resonant circuit 1. If a condition of (Equation 1) $Lp<1/(\omega r^2 \times Cp)$ is met, the anti-resonant frequency of the resonant circuit 1 is at the high frequency side of the resonant frequency thereof. If a condition of (Equation 2) $Lp>1/(\omega r^2 \times Cp)$ is met, the anti-resonant frequency of the resonant circuit 1 is at the low frequency side of the resonant frequency thereof.

Figure 2:
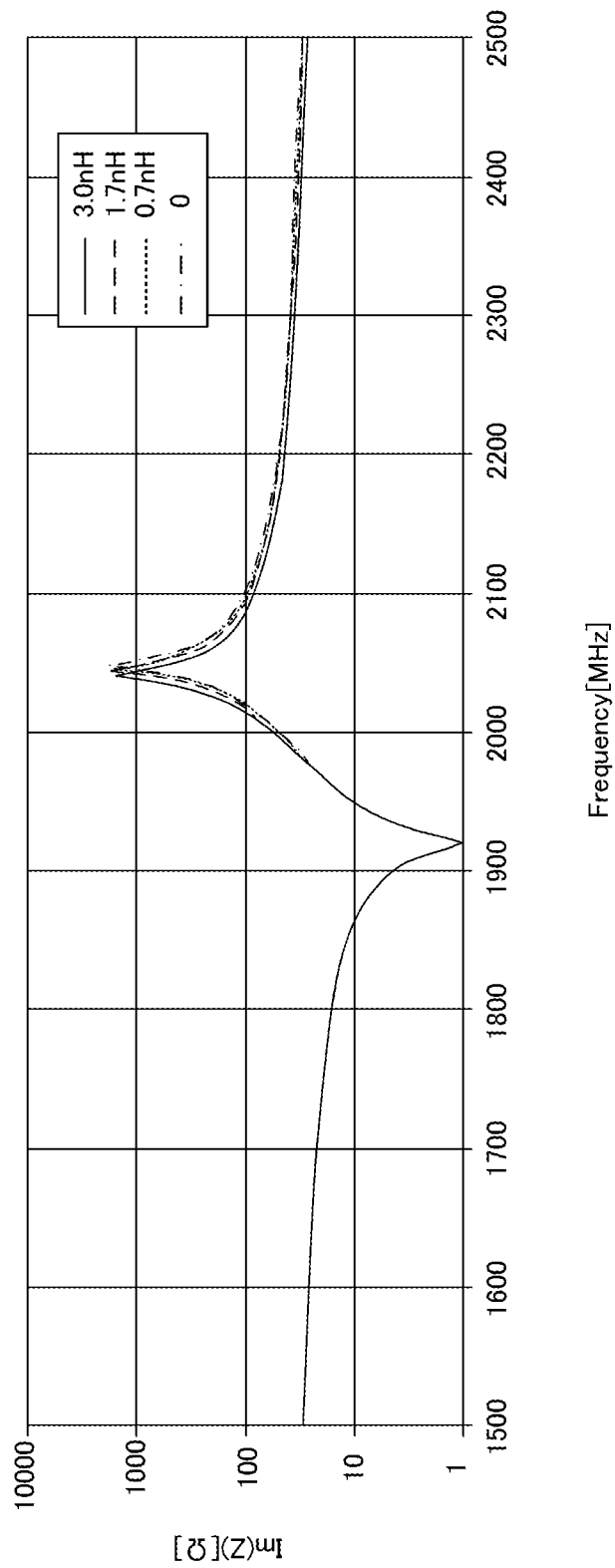
FIG. 2 is a graph illustrating impedance characteristics of the resonant circuit when an anti-resonance point of the resonant circuit is at the high frequency side of a resonance point thereof.

FIG. 2 is a graph illustrating impedance characteristics of the resonant circuit 1 when the anti-resonant frequency of the resonant circuit 1 is at the high frequency side of the resonance point thereof. Referring to FIG. 2, the vertical axis represents impedance value of the resonant circuit 1 and the horizontal axis represents signal frequency [MHz] of the resonant circuit 1. The resonant circuit 1 has a resonant frequency of about 1,920 MHz. When Cp=0.5 pF, $Lp=1/(\omega r^2 \times Cp) \cong 13.6$ nH. Accordingly, selection of the inductor 15 that meets Lp<13.6 nH causes the anti-resonance point of the resonant circuit 1 to be positioned at the high frequency side of the resonance point thereof.

An example of how the impedance characteristics of the resonant circuit 1 are varied when the value of the inductance Lp is varied with the capacitance Cp fixed to a value of 0.5 pF (Cp=0.5 pF) is illustrated in FIG. 2. A solid line indicates a characteristic when Lp=3.0 nH, a broken line indicates a characteristic when Lp=1.7 nH, a dotted line indicates a characteristic when Lp=0.7 nH, and an alternate long and short dash line indicates a characteristic when Lp=0 nH. Since each inductance Lp of the inductor 15 meets Lp<13.6 nH, as described above, the anti-resonance point of the resonant circuit 1 is at the high frequency side of the resonance point thereof in FIG. 2. Fixing the inductance of the inductor 15 and varying the capacitance of the variable capacitor 14 so that the relationship in Equation 1 is held enable the frequency at the anti-resonance point to be varied. For example, varying the capacitance Cp so that the relationship in Equation 1 is held with the inductance Lp fixed to a value of 3.0 nH (Lp=3.0 nH) in the resonant circuit 1 enables the anti-resonance point to be appropriately adjusted at the high frequency side of the resonance point.

Figure 3:
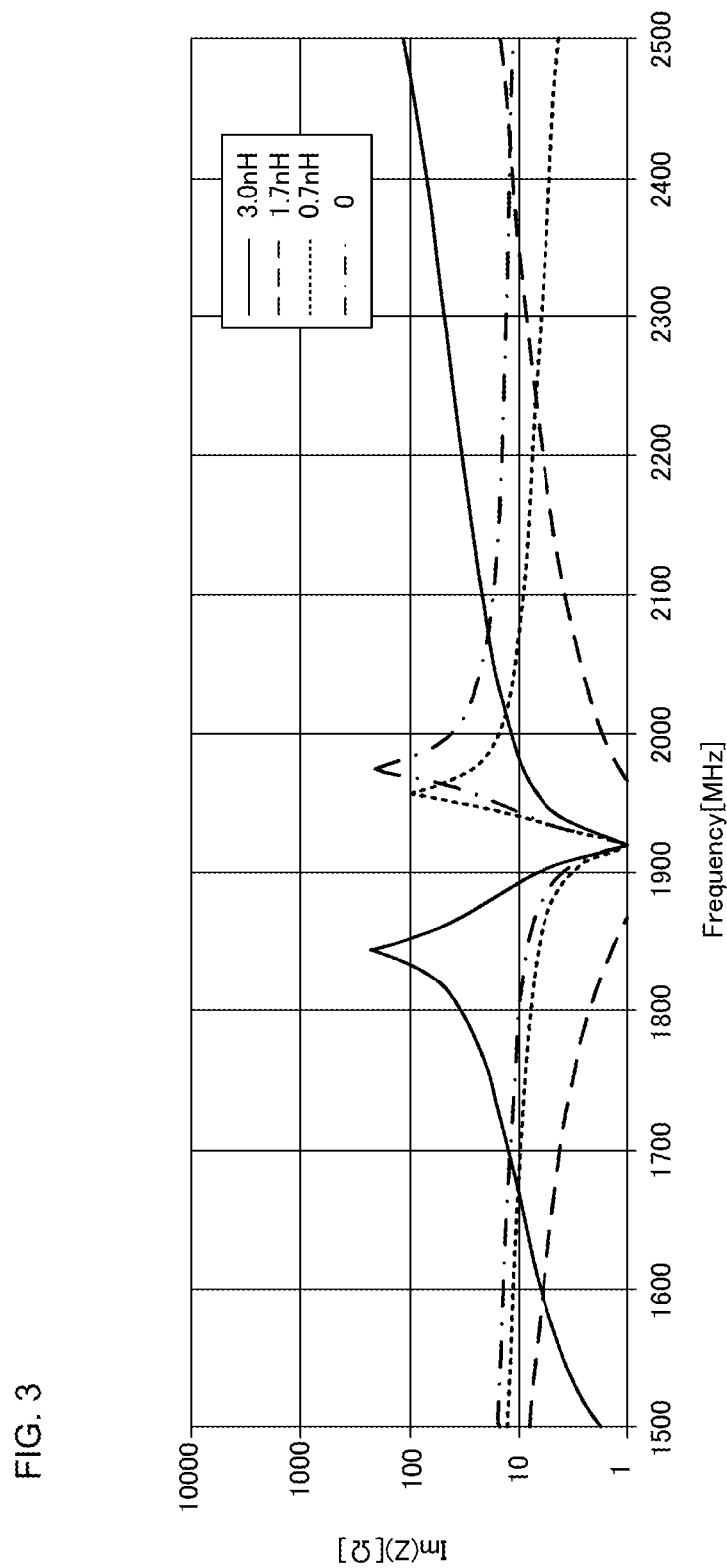
FIG. 3 is a graph illustrating impedance characteristics of the resonant circuit when the anti-resonance point of the resonant circuit is at the low frequency side of the resonance point thereof.

FIG. 3 is a graph illustrating impedance characteristics of the resonant circuit 1 when the anti-resonant frequency of the resonant circuit 1 is at the low frequency side of the resonance point thereof. Referring to FIG. 3, the vertical axis represents impedance value of the resonant circuit 1 and the horizontal axis represents signal frequency [MHz] of the resonant circuit 1. When Cp=4.0 pF, $Lp=1/(\omega r^2 \times Cp) \cong 1.72$ nH. Accordingly, selection of the inductor 15 that meets Lp>1.72 nH causes the anti-resonance point of the resonant circuit 1 to be positioned at the low frequency side of the resonance point thereof.

An example of how the impedance characteristics of the resonant circuit 1 are varied when the value of the inductance Lp is varied with the capacitance Cp fixed to a value of 4.0 pF (Cp=4.0 pF) is illustrated in FIG. 3. A solid line indicates a characteristic when Lp=3.0 nH, a broken line indicates a characteristic when Lp=1.7 nH, a dotted line indicates a characteristic when Lp=0.7 nH, and an alternate long and short dash line indicates a characteristic when Lp=0 nH. In the example in FIG. 3, Lp=3.0 nH meets Lp>1.72 nH. Accordingly, in the case of the characteristic indicated by the solid line, the anti-resonance point of the resonant circuit 1 is positioned at the low frequency side of the resonance point thereof. Fixing the inductance of the inductor 15 and varying the capacitance of the variable capacitor 14 so that the relationship in Equation 2 is held enable the frequency at the anti-resonance point to be varied.

FIG. 2 and FIG. 3 illustrate that either of Equation 1 and Equation 2 is met by varying the capacitance Cp even when the inductance Lp is fixed to a value of 3.0 nH (Lp=3.0 nH). Accordingly, varying the capacitance Cp enables the positions of the transmission frequency band and the reception frequency band on the frequency axis to be varied, thereby supporting a greater variety of characteristics.

As described above, in the resonant circuit 1 according to the present embodiment, selecting the variable capacitor 14 and the inductor 15 so as to meet the condition $Lp<1/(\omega r^2 \times Cp)$ enables the anti-resonance point to be positioned at the high frequency side of the resonance point and selecting the variable capacitor 14 and the inductor 15 so as to meet the condition $Lp>1/(\omega r^2 \times Cp)$ enables the anti-resonance point to be positioned at the low frequency side of the resonance point. Consequently, when a high-frequency filter including the resonant circuit 1 is configured, it is possible to realize a high-frequency filter having the reverse relationship between the pass band and the attenuation band at the same time.

In the resonant circuit 1 illustrated in FIG. 1, when the interval (band width ratio) between the resonance point and the anti-resonance point of the resonator 11 is short, connection of an inductor to the resonator 11 enables the band width ratio of the resonator 11 to be increased.

Figure 4:
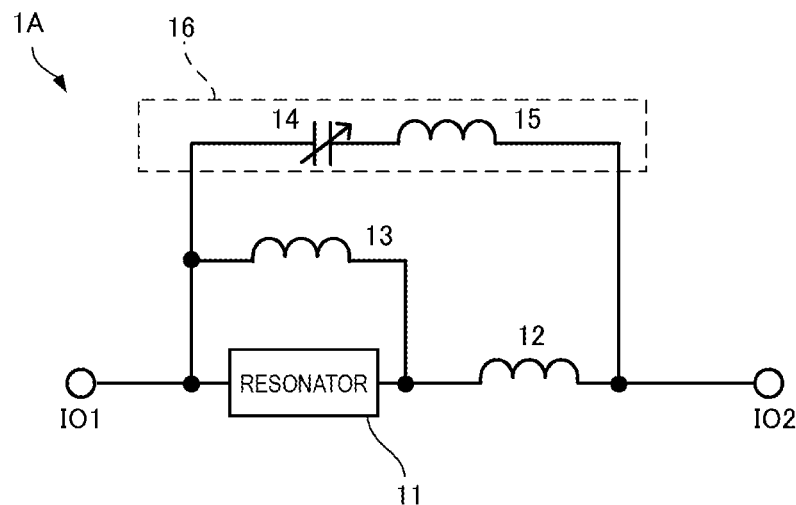
FIG. 4 is a circuit diagram of another exemplary resonant circuit according to the first embodiment.

FIG. 4 is a circuit diagram of another exemplary resonant circuit according to the first embodiment. A resonant circuit 1A illustrated in FIG. 4 includes an inductor 12 connected in series to the resonator 11. An inductor 13 is connected in parallel to the resonator 11. Each of the inductors 12 and 13 is an element for shifting the resonance point and the anti-resonance point of the resonator 11 and is a so-called extension coil.

Figure 5:
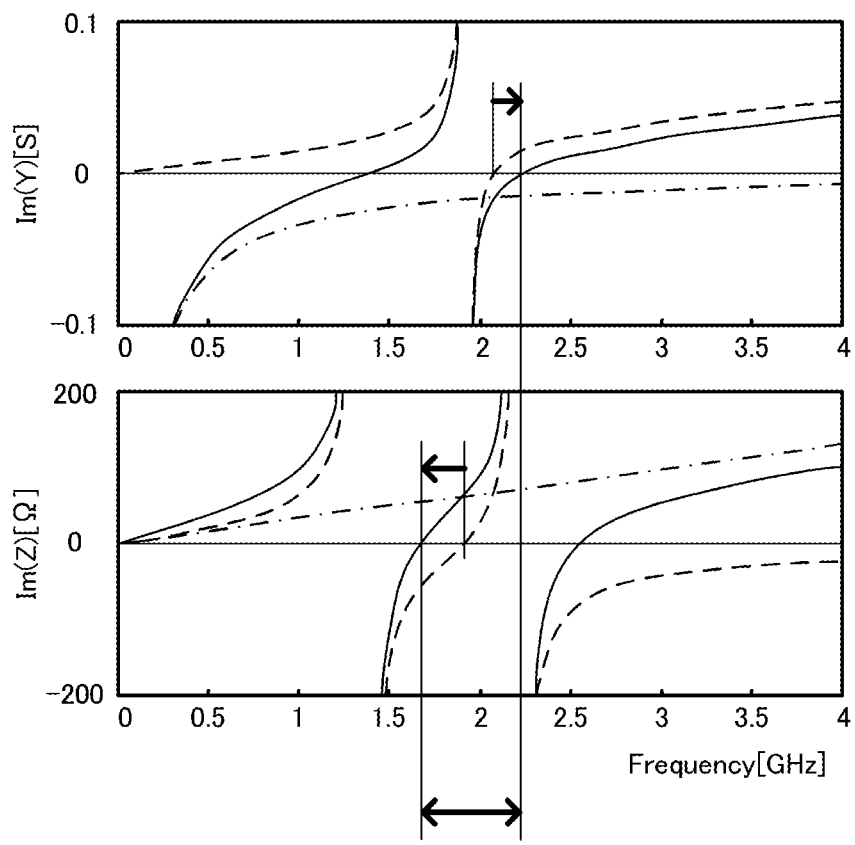
FIG. 5 includes diagrams for describing how the resonance point and the anti-resonance point move when inductors are connected to the resonator.

FIG. 5 includes diagrams for describing how the resonance point and the anti-resonance point move when the inductors 12 and 13 are connected to the resonator 11. An upper diagram in FIG. 5 illustrates admittance characteristics of a circuit in which the inductor 13 is connected in parallel to the resonator 11. A lower diagram in FIG. 5 illustrates impedance characteristics of a circuit in which the inductor 12 is connected in series to the parallel circuit composed of the resonator 11 and the inductor 13.

In the diagram illustrating the admittance characteristics in FIG. 5, the vertical axis represents admittance value [S] and the horizontal axis represents signal frequency [GHz]. Solid lines indicate a characteristic of the parallel circuit composed of the resonator 11 and the inductor 13, broken lines indicate a characteristic of the resonator 11, and an alternate long and short dash line indicates a characteristic of the inductor 13. In the upper diagram in FIG. 5, the anti-resonance point of the parallel circuit composed of the resonator 11 and the inductor 13 (the frequency when the admittance value in the broken lines is equal to zero) is shifted toward higher frequencies from the anti-resonance point of the resonator 11, as illustrated by an arrow in the diagram. In other words, the connection of the inductor 13 in parallel to the resonator 11 shifts the anti-resonance point of the resonator 11 toward higher frequencies.

In the diagram illustrating the impedance characteristics in FIG. 5, the vertical axis represents impedance value [Ω] and the horizontal axis represents signal frequency [GHz]. Solid lines indicate a characteristic of the series circuit in which the inductor 12 is connected in series to the parallel circuit composed of the resonator 11 and the inductor 13, broken lines indicate a characteristic of the parallel circuit composed of the resonator 11 and the inductor 13, and an alternate long and short dash line indicates a characteristic of the inductor 12. In the lower diagram in FIG. 5, the resonance point of the circuit including the resonator 11 and the inductors 12 and 13 (the frequency when the impedance value in the broken lines is equal to zero) is shifted toward lower frequencies from the resonance point of the parallel circuit composed of the resonator 11 and the inductor 13, as illustrated by an arrow in the diagram. In other words, the connection of the inductor 12 in series to the parallel circuit composed of the resonator 11 and the inductor 13 shifts the resonance point of the resonator 11 toward lower frequencies.

As described above, the connection of the inductor 12 in series to the resonator 11 and the connection of the inductor 13 in parallel to the resonator 11 enable the resonance point and the anti-resonance point of the resonator 11 to be shifted to increase the interval between the resonance point and the anti-resonance point. Consequently, as in the resonant circuit 1 illustrated in FIG. 1, in the adjustment of the anti-resonance point by varying the capacitance of the variable capacitor, the variable width of the anti-resonance point is increased.

Increasing the value of the capacitance Cp of the variable capacitor causes the inductance Lp of the inductor 15 to have a relatively small value according to the above equation $Lp=1/(\omega r^2 \times Cp)$. Accordingly, forming the inductor 15 of a routing wiring on a low-temperature-sintered laminated ceramic substrate or a resin substrate or a routing wiring on a chip on which a piezoelectric element, such as a SAW filter or a piezoelectric thin-film resonator filter, is formed enables the small inductor 15 to be manufactured with high precision. It is difficult to manufacture the inductor 15 with high precision when the inductance Lp has a value around 0 nH. The inductance Lp generally has a value of 0.2 nH or higher and is desirably has a value of 1.0 nH or higher because the variation in manufacturing is reduced in such a case.

Second Embodiment

A resonant circuit according to a second embodiment will now be described. The resonant circuit according to the second embodiment differs from that in the first embodiment in that both the resonance point and the anti-resonance point are capable of being adjusted.

Figure 6:
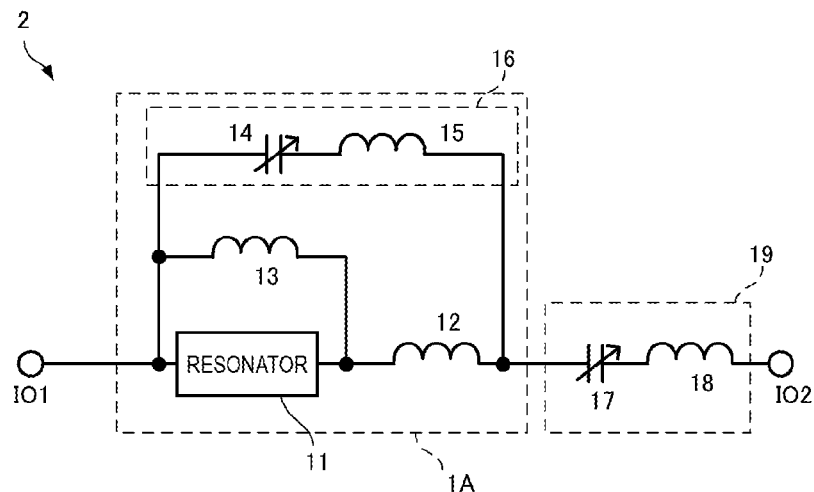
FIG. 6 is a circuit diagram of a resonant circuit according to a second embodiment

FIG. 6 is a circuit diagram of the resonant circuit according to the second embodiment. A resonant circuit 2 has a configuration in which a series circuit 19 composed of a variable capacitor 17 and an inductor 18, which are connected in series to each other, is further connected to the resonant circuit 1A according to the first embodiment. The connection of the variable capacitor 17 and the inductor 18 in series to the resonator 11 enables the resonance point of the resonator 11 to be adjusted.

Figure 7:
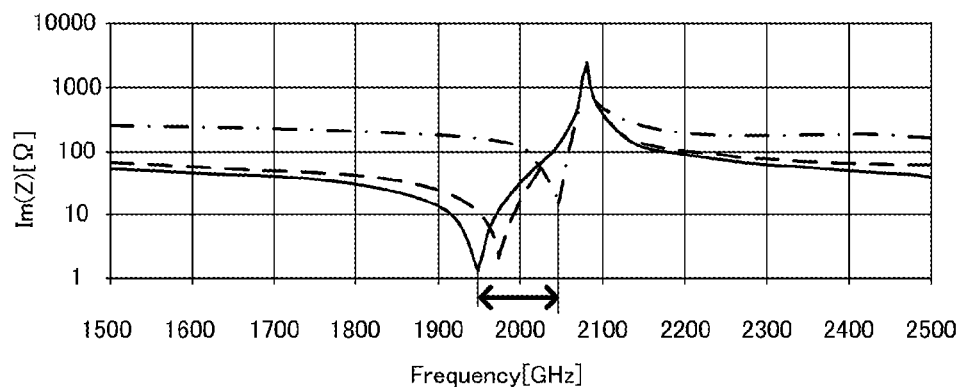
FIG. 7 is a graph illustrating impedance characteristics of a circuit in which a variable capacitor and an inductor are connected in series to the resonator.

FIG. 7 is a graph illustrating impedance characteristics of the circuit in which the variable capacitor 17 and the inductor 18 are connected in series to the resonator 11. The impedance characteristics in FIG. 7 are exhibited when the element values of the variable capacitor 14 and the inductors 12, 13, and 15 are set to zero. When the capacitance of the variable capacitor 17 is denoted by Cs and the inductance of the inductor 18 is denoted by Ls, a solid line in FIG. 7 indicates a characteristic when Cs=4.0 pF and Ls=1.0 nH, a broken line in FIG. 7 indicates a characteristic when Cs=4.0 pF and Ls=0 nH, and an alternate long and short dash line in FIG. 7 indicates a characteristic when Cs=0.5 pF and Ls=1 nH. As illustrated by an arrow in FIG. 7, the connection of the variable capacitor 17 and the inductor 18 in series to the resonator 11 varies the resonant frequency.

As described above, in the resonant circuit 2 according to the present embodiment, the variable capacitor 17 and the inductor 18 are further connected in series to the resonant circuit 1A according to the first embodiment. With the resonant circuit 2 according to the present embodiment, not only the anti-resonance point but also the resonance point is capable of being adjusted. Accordingly, when a high-frequency filter including the resonant circuit 2 is configured, both the bandpass characteristics and the attenuation band of the high-frequency filter are capable of being adjusted. Consequently, it is possible to realize a high-frequency filter capable of achieving multiple desired transmission characteristics with one resonant circuit 2, thereby supporting a much greater variety of characteristics.

Figure 8:
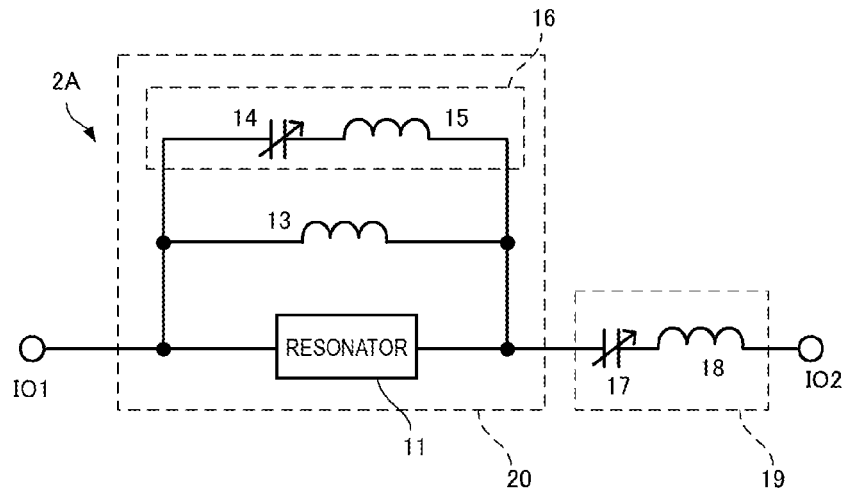
FIG. 8 is a circuit diagram of a resonant circuit having a configuration different from that of the resonant circuit according to the second embodiment.
Figure 9:
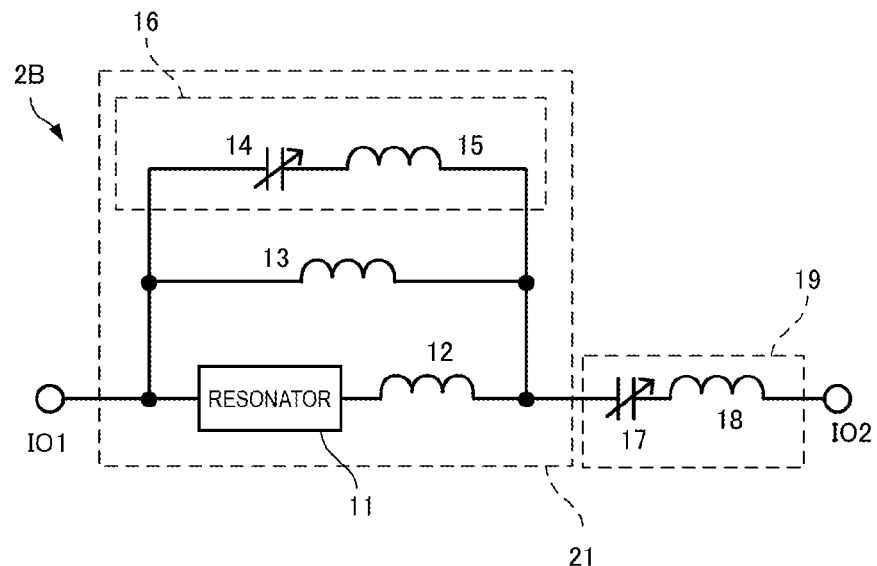
FIG. 9 is a circuit diagram of a resonant circuit having a configuration different from that of the resonant circuit according to the second embodiment.
Figure 10:
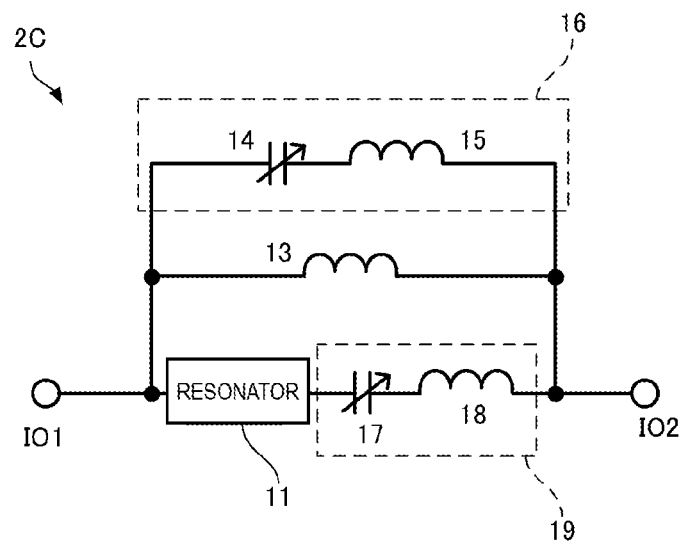
FIG. 10 is a circuit diagram of a resonant circuit having a configuration different from that of the resonant circuit according to the second embodiment.

Modifications of the resonant circuit 2 according to the second embodiment will now be described. FIG. 8, FIG. 9, and FIG. 10 are circuit diagrams of resonant circuits having configurations different from the configuration of the resonant circuit 2 according to the second embodiment.

A resonant circuit 2A illustrated in FIG. 8 includes a parallel circuit 20 in which the inductor 13 and the series circuit 16 are connected in parallel to the resonator 11. In addition, the series circuit 19 is connected in series to the parallel circuit 20. Comparison of the resonant circuit 2A with the resonant circuit 2 illustrated in FIG. 6 indicates that the inductor 12 is not connected in series to the resonator 11. With this configuration, in the resonant circuit 2A, the anti-resonant frequency is capable of being shifted while degradation in impedance at the anti-resonance point of the resonator 11 is suppressed. The series circuit 16 adjusts the anti-resonance point of the resonant circuit 2A and the series circuit 19 adjusts the resonance point of the resonant circuit 2A.

A resonant circuit 2B illustrated in FIG. 9 includes a parallel circuit 21 in which the inductor 13 and the series circuit 16 are connected in parallel to the resonator 11 and the inductor 12, which are connected in series to each other. In addition, the series circuit 19 is connected in series to the parallel circuit 21. With the resonant circuit 2B, the inductor 12 connected in series to the resonator 11 enables the resonance point of the resonator 11 to be shifted toward lower frequencies and the inductor 13 enables the anti-resonance point of the resonator 11 to be shifted toward higher frequencies. In this case, the amount of shift at the resonance point is greater than that in the resonant circuit 1A illustrated in FIG. 4. The variable capacitor 14 and the inductor 15 enable the anti-resonance point of the resonant circuit 2B to be adjusted and the variable capacitor 17 and the inductor 18 enable the resonance point of the resonant circuit 2B to be adjusted.

In a resonant circuit 2C illustrated in FIG. 10, the series circuit 19 is connected in series to the resonator 11. The inductor 13 and the series circuit 16 are connected in parallel to the resonator 11 and the series circuit 19, which are connected in series to each other. With the resonant circuit 2C, the series circuit 19 adjusts the resonance point, the inductor 13 shifts the anti-resonance point toward higher frequencies, and the series circuit 16 adjusts the anti-resonance point.

With any of the resonant circuits illustrated in FIG. 8 to FIG. 10, the resonance point and the anti-resonance point of the resonant circuit are capable of being adjusted. When a high-frequency filter including any of the resonant circuits is configured, both the bandpass characteristics and the attenuation band of the high-frequency filter are capable of being adjusted. Accordingly, it is possible to realize a high-frequency filter capable of achieving multiple desired transmission characteristics with one resonant circuit.

Third Embodiment

Figure 11:
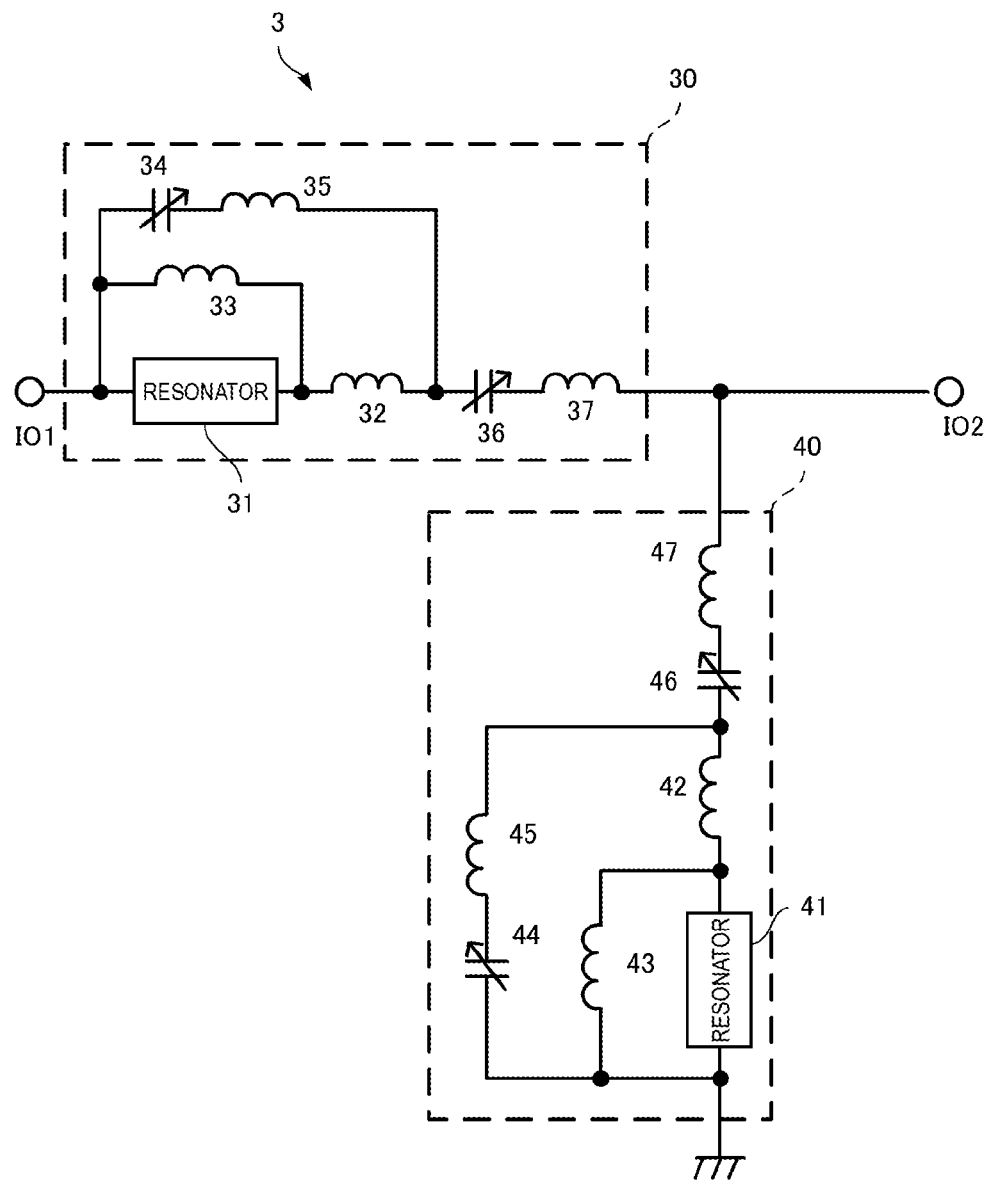
FIG. 11 is a circuit diagram of a high-frequency filter according to a third embodiment.

FIG. 11 is a circuit diagram of a high-frequency filter according to a third embodiment. A high-frequency filter 3 according to the present embodiment includes a resonant circuit 30 connected to a signal line between the input-output terminals IO1 and IO2 and a resonant circuit 40 one end of which is connected to the signal line and the other end of which is grounded. The resonant circuits 30 and 40 each has the same configuration as that of the resonant circuit 2 according to the second embodiment. Specifically, an inductor 33 (43) is connected in parallel to a resonator 31 (41). An inductor 32 (42), a variable capacitor 36 (46), and an inductor 37 (47) are connected in series to the resonator 31 (41). A variable capacitor 34 (44) and an inductor 35 (45), which are connected in series to each other, are connected in parallel to the resonator 31 (41) and the inductor 32 (42), which are connected in series to each other.

In the high-frequency filter 3, the resonant circuits 30 and 40 have different resonant frequencies and anti-resonant frequencies. Accordingly, the high-frequency filter 3 operates as a band pass filter using a certain frequency band as the pass band. In addition, adjusting the capacitances of the variable capacitors 34, 36, 44, and 46 in the resonant circuits 30 and 40 enables the pass band of the high-frequency filter 3 to be shifted with little variation in the loss. In other words, it is possible to realize the band pass filter which has a low insertion loss and the frequency band of which is variable.

The resonant circuits to be combined with each other to configure the high-frequency filter may have the same configuration as that of the resonant circuit 1 according to the first embodiment.

Fourth Embodiment

Figure 12:
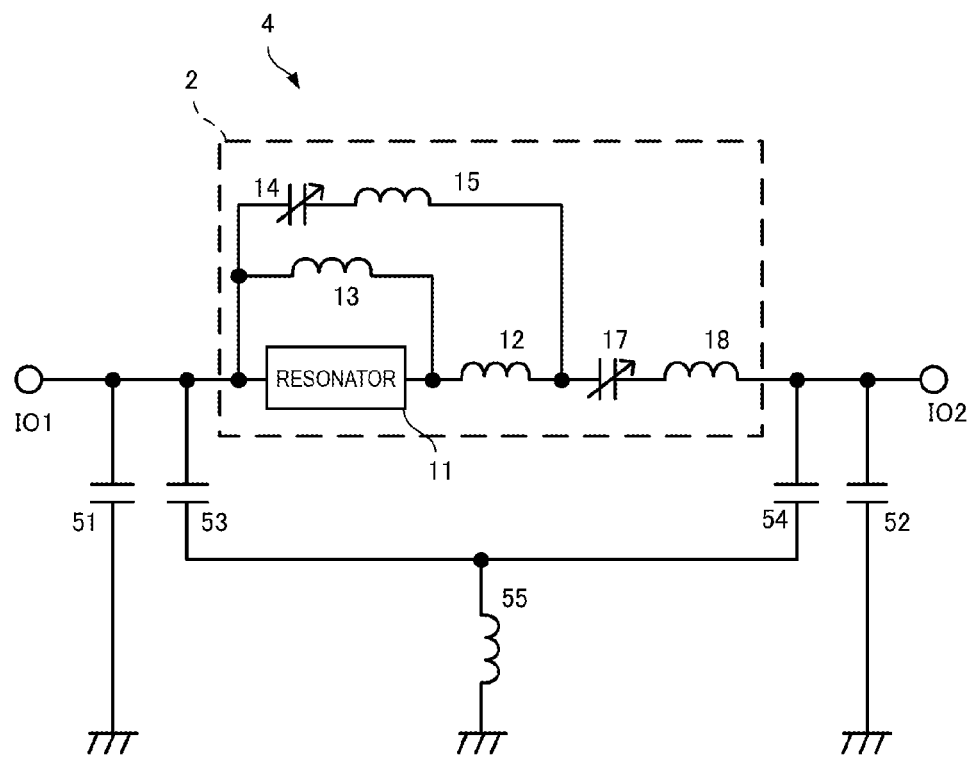
FIG. 12 is a circuit diagram of a high-frequency filter according to a fourth embodiment.

FIG. 12 is a circuit diagram of a high-frequency filter according to a fourth embodiment. A high-frequency filter 4 includes the resonant circuit 2 according to the second embodiment. In addition, the high-frequency filter 4 includes a matching capacitor 51 connected between the input-output terminal IO1 and the ground, a matching capacitor 52 connected between the input-output terminal IO2 and the ground, capacitors 53 and 54 connected to the input end and the output end of the resonant circuit 2, and an inductor 55 connected between the capacitors, 53, 54, and the ground.

Figure 13:
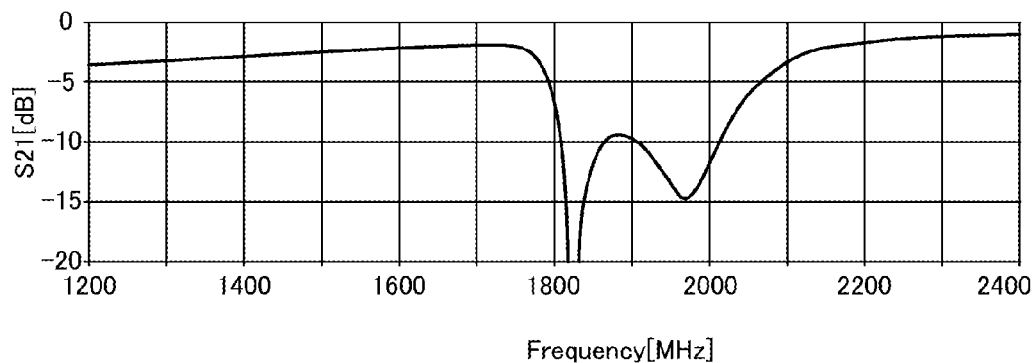
FIG. 13 illustrates pass band characteristics of the high-frequency filter.
Figure 14:
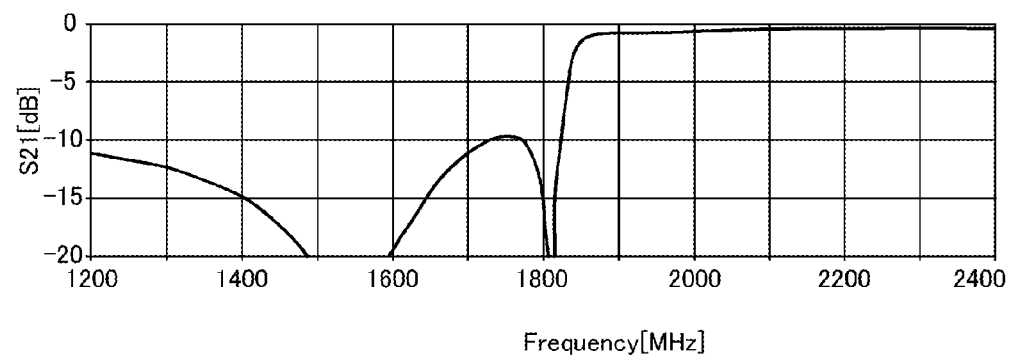
FIG. 14 illustrates pass band characteristics of the high-frequency filter.
Figure 15:
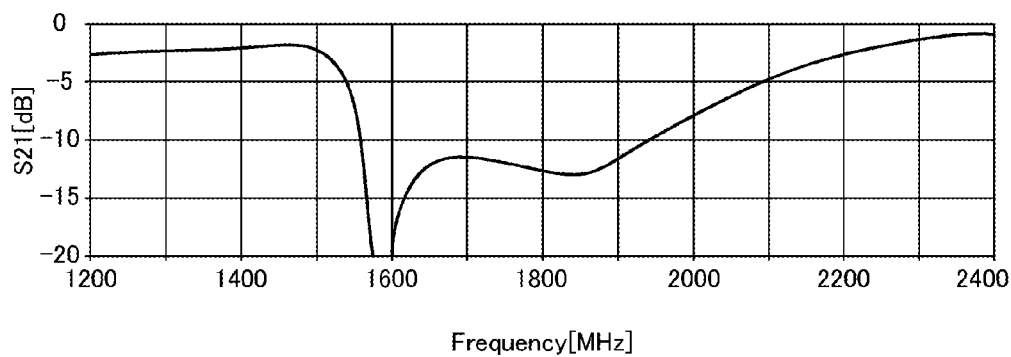
FIG. 15 illustrates pass band characteristics of the high-frequency filter.

FIG. 13, FIG. 14, and FIG. 15 are graphs illustrating pass band characteristics of the high-frequency filter 4. Referring to FIG. 13, FIG. 14, and FIG. 15, the horizontal axis represents frequency [MHz] and the vertical axis represents insertion loss S21 [dB]. It is assumed in the following that the capacitances of the capacitors 51 and 52 in FIG. 11 are equal to 0.8 pF, the capacitances of the capacitors 53 and 54 in FIG. 11 are equal to 0.9 pF, the inductance of the inductor 55 in FIG. 11 is equal to 5.1 nH, the inductances of the inductors 12 and 13 in FIG. 11 are equal to 0, and the inductances of the inductors 15 and 18 in FIG. 11 are equal to 4.0 nH.

FIG. 13 illustrates the pass band characteristics when the capacitances of the variable capacitors 14 and 17 are set to 0.5 pF and 1.4 pF, respectively. In this case, the pass band of the high-frequency filter 4 is positioned in a frequency band of about 1,800 MHz or lower and the frequency band higher than or equal to 1,800 MHz is used as the attenuation band. FIG. 14 illustrates the pass band characteristics when the capacitances of the variable capacitors 14 and 17 are set to 1.0 pF and 2.2 pF, respectively. In this case, the pass band of the high-frequency filter 4 is positioned in a frequency band of about 1,850 MHz or higher and the frequency band lower than or equal to 1,850 MHz is used as the attenuation band. FIG. 15 illustrates the pass band characteristics when the capacitances of the variable capacitors 14 and 17 are set to 4.0 pF and 4.0 pF, respectively. In this case, the pass band of the high-frequency filter 4 is positioned in a frequency band of about 1,550 MHz or lower and the frequency band higher than or equal to 1,550 MHz is used as the attenuation band.

As illustrated in FIG. 13 to FIG. 15, even with the high-frequency filters having the same configuration, varying the capacitances of the variable capacitors 14 and 17 enables the pass band and the attenuation band to be varied. The frequencies of the pass band and the attenuation band are capable of being varied with the single circuit configuration to set the attenuation pole at the high frequency side of the pass band or to set the attenuation pole at the low frequency side of the pass band. This allows a variety of filter characteristics to be realized with the single circuit configuration.

REFERENCE SIGNS LIST

IO1, IO2 input-output terminal
1, 1A, 2, 2A, 2B, 2C resonant circuit
3, 4 high-frequency filter
11 resonator
12, 13 inductor
14 variable capacitor (first variable capacitor)
15 inductor (first inductor)
16 series circuit (first series circuit)
17 variable capacitor (second variable capacitor)
18 inductor (second inductor)
19 series circuit (second series circuit)
20 parallel circuit
21 parallel circuit
30, 40 resonant circuit
31, 41 resonator
32, 33, 37 inductor
34, 36, 44, 46 variable capacitor
35 inductor
36 variable capacitor
51, 52, 53, 54 capacitor

The invention claimed is:

1. A resonator device comprising:
a resonator having a resonant frequency and an anti-resonant frequency; and
a first series circuit in which a first inductor is connected in series to a first variable capacitor,
wherein the first series circuit is connected in parallel to the resonator, and
wherein varying a capacitance of the first variable capacitor causes the anti-resonant frequency closest to the resonant frequency to be varied between a high frequency side and a low frequency side of the resonant frequency, such that:
when $Li > 1/(\omega r^2 \times Cp)$, the anti-resonant frequency is less than the resonant frequency, and
when $Li < 1/(\omega r^2 \times Cp)$ the anti-resonant frequency is greater than the resonant frequency, and
wherein $\omega r$ denotes a resonance angular frequency of the resonator, Li denotes an inductance of the first inductor, and Cp denotes the capacitance of the first variable capacitor.

2. The resonator device according to claim 1, wherein the first variable capacitor is a variable capacitance diode, a micro electro mechanical systems device, or a barium strontium titanate device.

3. The resonator device according to claim 1, wherein the inductance Li has a value of 0.2 nH or higher.

4. The resonator device according to claim 1 further comprising:
a second series circuit in which a second inductor is connected in series to a second variable capacitor,
wherein the second series circuit is connected in series to the resonator and the first series circuit.

5. The resonator device according to claim 1, further comprising: a third inductor connected in parallel to the resonator and the first series circuit.

6. The resonator device according to claim 5, further comprising:
a second series circuit in which a second inductor is connected in series to a second variable capacitor,
wherein the second series circuit is connected in series to the resonator, the first series circuit, and the third inductor.

7. The resonator device according to claim 5, further comprising:
a second series circuit in which a second inductor is connected in series to a second variable capacitor,
wherein the second series circuit is connected in series to the resonator, the first series circuit is connected in parallel to the resonator and second series circuit, and the third inductor is connected in parallel to the resonator and second series circuit.

8. The resonator device according to claim 1, further comprising:
a third inductor connected in parallel to the resonator and the first series circuit; and
a fourth inductor connected in series to the resonator.

9. The resonator device according to claim 8, further comprising:
a second series circuit in which a second inductor is connected in series to a second variable capacitor,
wherein the second series circuit is connected in series to the resonator, the first series circuit, and the fourth inductor.

10. The resonator device according to claim 8, further comprising:
a first capacitor connected between ground and a first end of the resonator device;
a second capacitor connected between ground and a second end of the resonator device;
a third capacitor and a fourth capacitor connected in series between the first end and the second end of the resonator device; and
a fifth inductor connected between ground and a node between the third capacitor and fourth capacitor.

11. The resonator device according to claim 1, wherein the resonator is a surface acoustic wave device.

12. The resonator device according to claim 1, wherein the resonator is a bulk acoustic wave device.

13. A high-frequency filter comprising:
the resonator device according to claim 1, wherein the high-frequency filter has a pass band and an attenuation band.

* * * * *